(12) United States Patent
Cheng et al.

(10) Patent No.: US 10,916,685 B2
(45) Date of Patent: Feb. 9, 2021

(54) PACKAGE STRUCTURE AND MANUFACTURING METHOD THEREOF

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Wei-Te Cheng, Taipei (TW); Kuo-Ming Chiu, New Taipei (TW); Meng-Sung Chou, New Taipei (TW); Kai-Chieh Liang, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/009,005

(22) Filed: Jun. 14, 2018

(65) Prior Publication Data
US 2018/0366623 A1   Dec. 20, 2018

Related U.S. Application Data

(60) Provisional application No. 62/519,218, filed on Jun. 14, 2017.

(51) Int. Cl.
*H01L 33/54* (2010.01)
*H01L 33/48* (2010.01)
(Continued)

(52) U.S. Cl.
CPC .......... *H01L 33/54* (2013.01); *H01L 33/486* (2013.01); *H01L 33/62* (2013.01); *H01L 33/56* (2013.01);
(Continued)

(58) Field of Classification Search
CPC ....... H01L 33/54; H01L 33/486; H01L 33/62; H01L 2933/005; H01L 2933/0033; H01L 33/56; H01L 25/0753
See application file for complete search history.

(56) References Cited

U.S. PATENT DOCUMENTS 8,344,404 B2 *  1/2013  Fujita .................... C03C 3/19
                                                         257/79
9,117,982 B2 *  8/2015  Ishihara ............... H01L 33/505
(Continued)

FOREIGN PATENT DOCUMENTS

CN          101567413 A      10/2009
CN          103682036 A       3/2014
(Continued)

*Primary Examiner* — Su C Kim
(74) *Attorney, Agent, or Firm* — Li & Cai Intellectual Property (USA) Office

(57) ABSTRACT

An package structure includes a substrate, a pair of electrodes and a solder pad layer both electrically connected to each other and respectively disposed on two opposite surfaces of the substrate, a lighting diode arranged above the substrate and electrically connected to the pair of electrodes, a wall disposed on the substrate and arranged around the lighting diode, and a package compound disposed inside of the wall and covering the lighting diode. The package compound includes an attaching portion disposed on a top surface of the lighting diode, and a surrounding portion arranged around the attaching portion. The surrounding portion has an annular slot arranged on a top surface thereof. A bottom end of the annular slot is located at a position aligning with 25%~90% of a thickness of the lighting diode along a height direction.

19 Claims, 16 Drawing Sheets

(51) Int. Cl.
*H01L 33/62* (2010.01)
*H01L 33/56* (2010.01)

(52) U.S. Cl.
CPC .......................... *H01L 2933/005* (2013.01); *H01L 2933/0033* (2013.01)

(56) References Cited

U.S. PATENT DOCUMENTS

| | | | | |
|---|---|---|---|---|
| 2009/0206353 | A1* | 8/2009 | Okazaki | H01L 33/54 257/98 |
| 2009/0278147 | A1* | 11/2009 | Suzuki | H01L 33/56 257/98 |
| 2012/0217531 | A1* | 8/2012 | Katsuno | H01L 33/40 257/99 |
| 2013/0140580 | A1* | 6/2013 | Wirth | H01L 33/54 257/76 |
| 2014/0071689 | A1* | 3/2014 | Yoon | F21V 7/00 362/296.01 |
| 2015/0287894 | A1* | 10/2015 | Toita | H01L 33/58 257/98 |
| 2016/0276557 | A1* | 9/2016 | Wada | H01L 33/22 |

FOREIGN PATENT DOCUMENTS

| | | |
|---|---|---|
| CN | 104701438 A | 6/2015 |
| CN | 106104821 A | 11/2016 |
| TW | I572064 B | 2/2017 |

\* cited by examiner

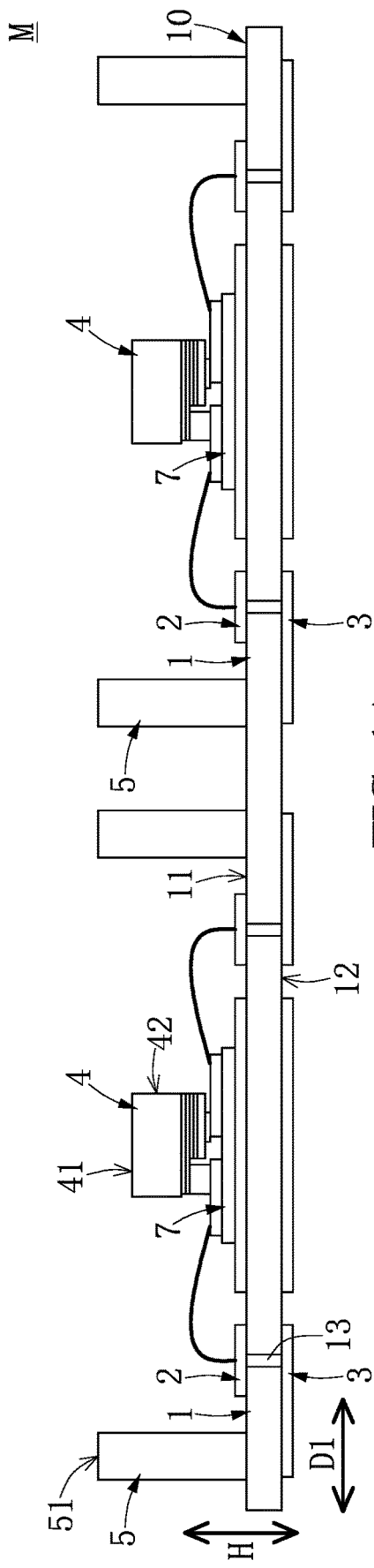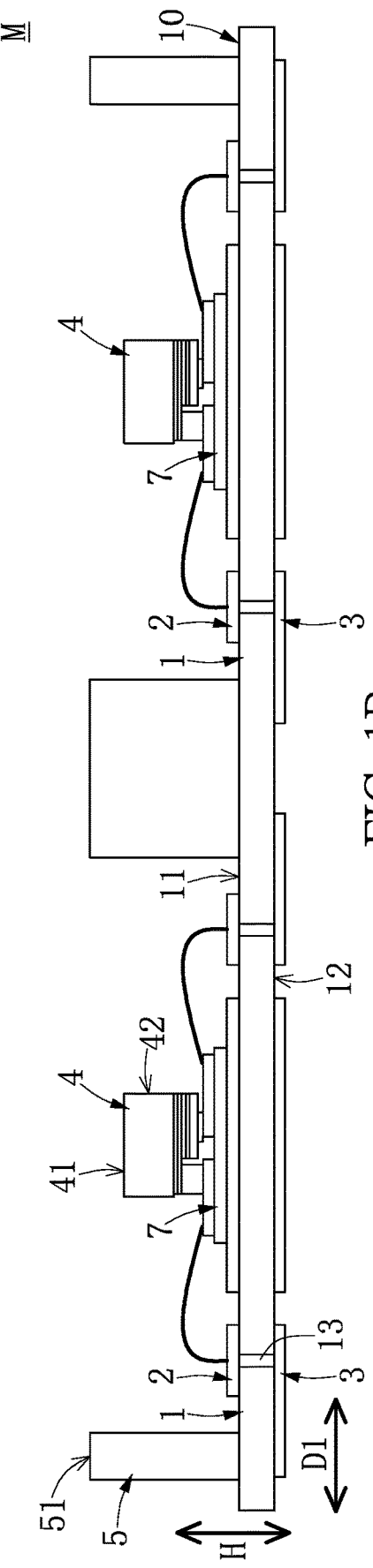

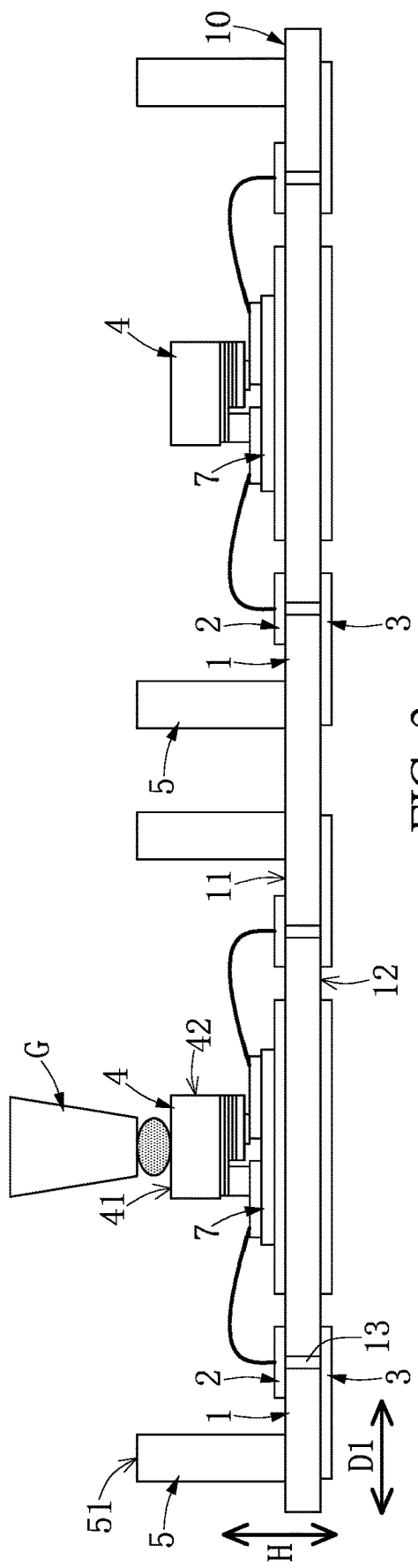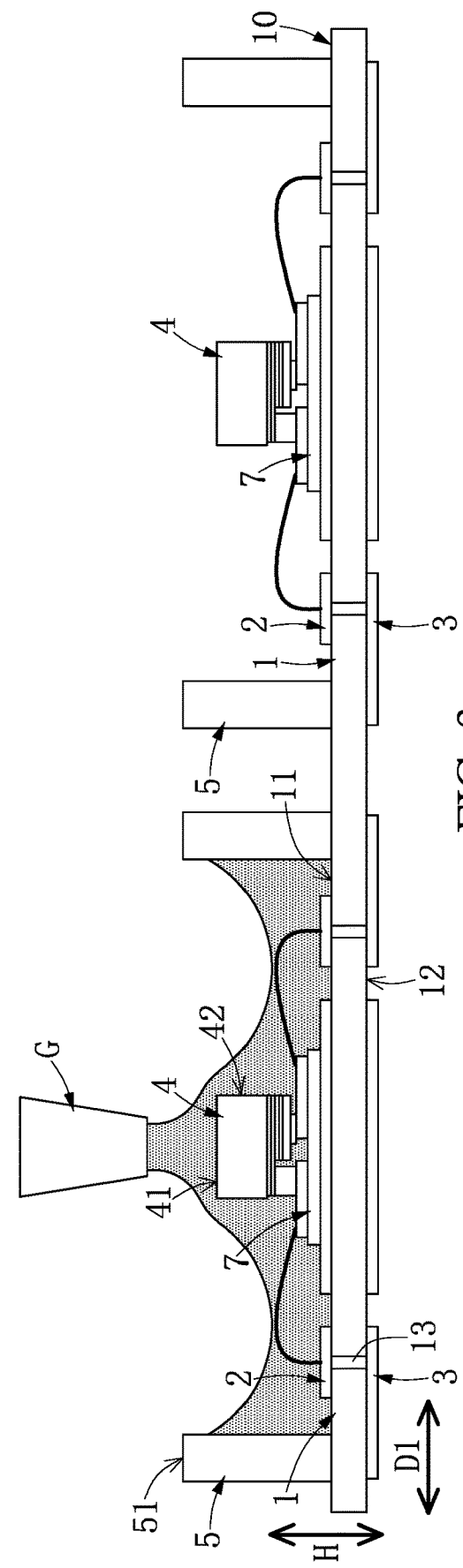

PACKAGE STRUCTURE AND MANUFACTURING METHOD THEREOF

BACKGROUND OF THE DISCLOSURE

Field of the Disclosure

The present disclosure relates to an LED package structure; in particular, to an LED package structure and a manufacturing method thereof.

Description of Related Art

A conventional package structure is provided with a package compound fully filled in a space defined by a wall of the conventional package structure.

SUMMARY OF THE DISCLOSURE

The present disclosure provides an LED package structure and a manufacturing method thereof to solve the drawbacks associated with conventional LED package structures, thereby increasing the performance of the LED package structure (e.g., a lighting efficiency) through particular configuration of a package compound. Moreover, the manufacturing method of the present disclosure can be carried out to effectively prevent spattering during a slicing process of a substrate assembly.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

BRIEF DESCRIPTION OF THE DRAWINGS

FIG. 1A is a schematic view showing step S110 of a manufacturing method of an LED package structure according to a first embodiment of the present disclosure;

FIG. 1B is a schematic view showing step S110' of the manufacturing method according to the first embodiment of the present disclosure;

FIG. 2 is a first schematic view showing step S120 of the manufacturing method according to the first embodiment of the present disclosure;

FIG. 3 is a second schematic view showing step S120 of the manufacturing method according to the first embodiment of the present disclosure;

DETAILED DESCRIPTION OF THE EXEMPLARY EMBODIMENTS

References are hereunder made to the detailed descriptions and appended drawings in connection with the present disclosure. However, the appended drawings are merely provided for exemplary purposes, and should not be construed as restricting the scope of the present disclosure.

First Embodiment

Reference is made to FIGS. 1A to 14, which illustrate a first embodiment of the present disclosure. The present embodiment discloses a package structure 100 and a manufacturing method thereof. In the present embodiment, the package structure 100 is an ultraviolet light-emitting diode for example, but the present disclosure is not limited thereto. In order to easily realize the package structure 100, the present embodiment discloses the manufacturing method thereof, and then discloses the structure and connection relationship of each component of the package structure 100.

As shown in FIGS. 1A to 13, the manufacturing method of the present embodiment includes steps S110~S170. However, in other embodiments of the present disclosure, any one of the steps S110~S170 can be omitted or changed by a reasonable step according to design requirements.

Figure 5:
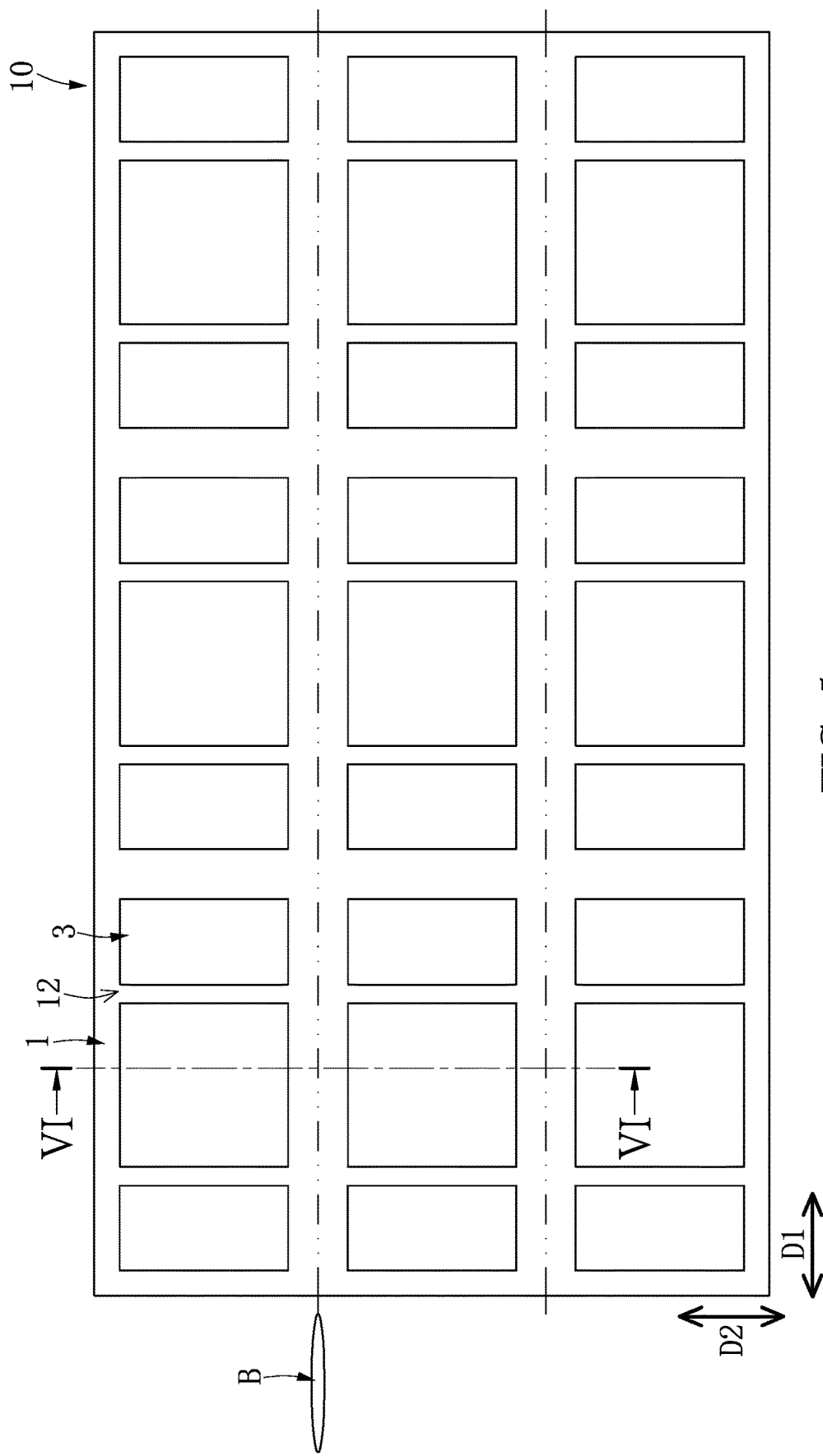
FIG. 5 is a schematic view showing step S130 of the manufacturing method according to the first embodiment of the present disclosure.

As shown in FIG. 1A, the step S110 is carried out by providing a carrier module M. The carrier module M includes a substrate assembly 10, a plurality of pairs of electrodes 2, a plurality of solder pad layers 3, a plurality of lighting diodes 4, and a plurality of annular walls 5. In the present embodiment, each pair of electrodes 2 is an electrode layer 2 for example, and each of the lighting diodes 4 is an ultraviolet light-emitting diode chip for example, but the present disclosure is not limited thereto. Specifically, the substrate assembly 10 includes a plurality of substrates 1 (as shown in FIG. 5) that are integrally formed as a one-piece structure and are connected to each other along a first direction D1 and a second direction D2 perpendicular to the first direction D1. Moreover, each of the substrates 1 has a first surface 11 and a second surface 12 opposite to the first surface 11. Each of the first surface 11 and the second surface 12 is substantially parallel to the first direction D1 and the second direction D2 (as shown in FIG. 5).

The electrode layers 2 are respectively disposed on the first surfaces 11 of the substrates 1, and the walls 5 are respectively disposed on the first surfaces 11 of the substrates 1. The lighting diodes 4 are respectively disposed in the walls 5, and the lighting diodes 4 are arranged to respectively correspond in position to the first surfaces 11 of the substrates 1. The solder pad layers 3 are respectively disposed on the second surfaces 12 of the substrates 1.

The electrode layer 2, the lighting diode 4, and the solder pad layer 3, which are disposed on the same substrate 1, are electrically connected to each other. Specifically, each of the substrates 1 is provided with a plurality of conductive pillars 13 embedded therein. An end of each of the conductive pillars 13 is exposed from the first surface 11 of the substrate 1 and is connected to the electrode layer 2, and another end of each of the conductive pillars 13 is exposed from the second surface 12 of the substrate 1 and is connected to the solder pad layer 3, such that the electrode layer 2 and the solder pad layer 3 are electrically connected to each other through the conductive pillars 13.

Moreover, the electrical connection manner between the lighting diode 4 and the electrode layer 2 can be adjusted or changed according to design requirements. For example, as shown in FIG. 1A, the lighting diode 4 is connected to a submount 7 fixed on the electrode layer 2 in a flip-chip bonding manner, and the submount 7 is electrically connected to the electrode layer 2 in a wiring manner for establishing the electrical connection between the lighting diode 4 and the electrode layer 2. Or, as shown in FIG. 5, the lighting diode 4 can be directly mounted on the electrode layer 2 for establishing the electrical connection therebetween.

Figure 4:
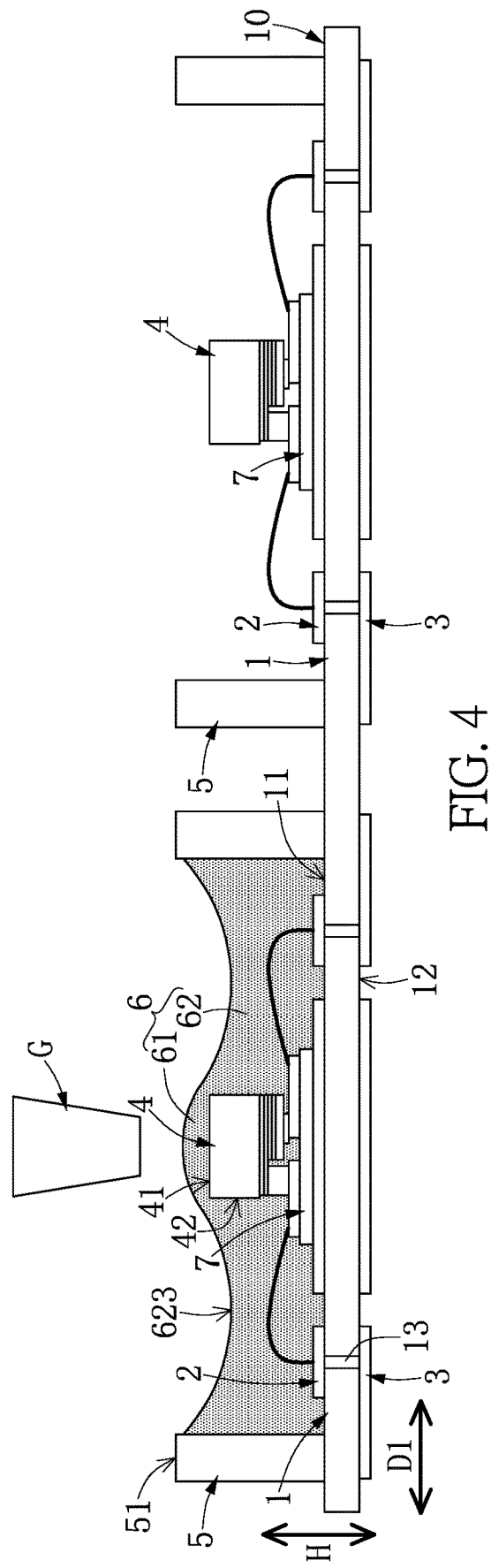
FIG. 4 is a third schematic view showing step S120 of the manufacturing method according to the first embodiment of the present disclosure.

As shown in FIGS. 2 to 4, the step S120 is carried out by implementing a dispensing process to an inner side of each of the walls 5 by using a dispenser G. As shown in FIG. 2, in each of the dispensing processes, the dispenser G outputs a package compound 6 toward a top surface 41 of the lighting diode 4 so as to form an attaching portion 61 arranged on the top surface 41 of the lighting diode 4. As shown in FIG. 3, the package compound 6 further flows from a peripheral part of the attaching portion 61 toward the wall 5 and the substrate 1 so as to form a surrounding portion 62. As shown in FIG. 4, the electrode layer 2 and the lighting diode 4 are embedded in the package compound 6. The surrounding portion 62 has an annular slot formed on a top surface 623 thereof, a bottom end 6231 of the annular slot is located at a position aligning with 25%~90% of a thickness T of an lighting unit U (e.g., the lighting diode 4 and the submount 7) along a height direction H that is perpendicular to the first surface 11, but the present disclosure is not limited thereto.

It should be noted that the thickness T of the lighting diode 4 and the submount 7 in the present embodiment is defined by a distance from a bottom end of the submount 7 to the top surface 41 of the lighting diode 4. In other words, the bottom end of the lighting diode 4 is aligned with a position corresponding to 0% of the thickness T, and the top surface 41 of the lighting diode 4 is aligned with a position corresponding to 100% of the thickness T.

Specifically, as shown in FIGS. 2 to 4, in each of the dispensing processes, the dispenser G starts to output the package compound 6 at a first position that is about 0.2 mm above the top surface 41 of the lighting diode 4 (as shown in FIG. 2), and then the dispenser G gradually moves in a direction away from the top surface 41 (an upward direction as shown in FIG. 3) until reaching a second position that is about 0.5 mm above the top surface 41 of the lighting diode 4 (as shown in FIG. 4). Moreover, the dispenser G at the second position stops outputting the package compound 6 for 0.3 seconds, but the present disclosure is not limited thereto.

Figure 6:
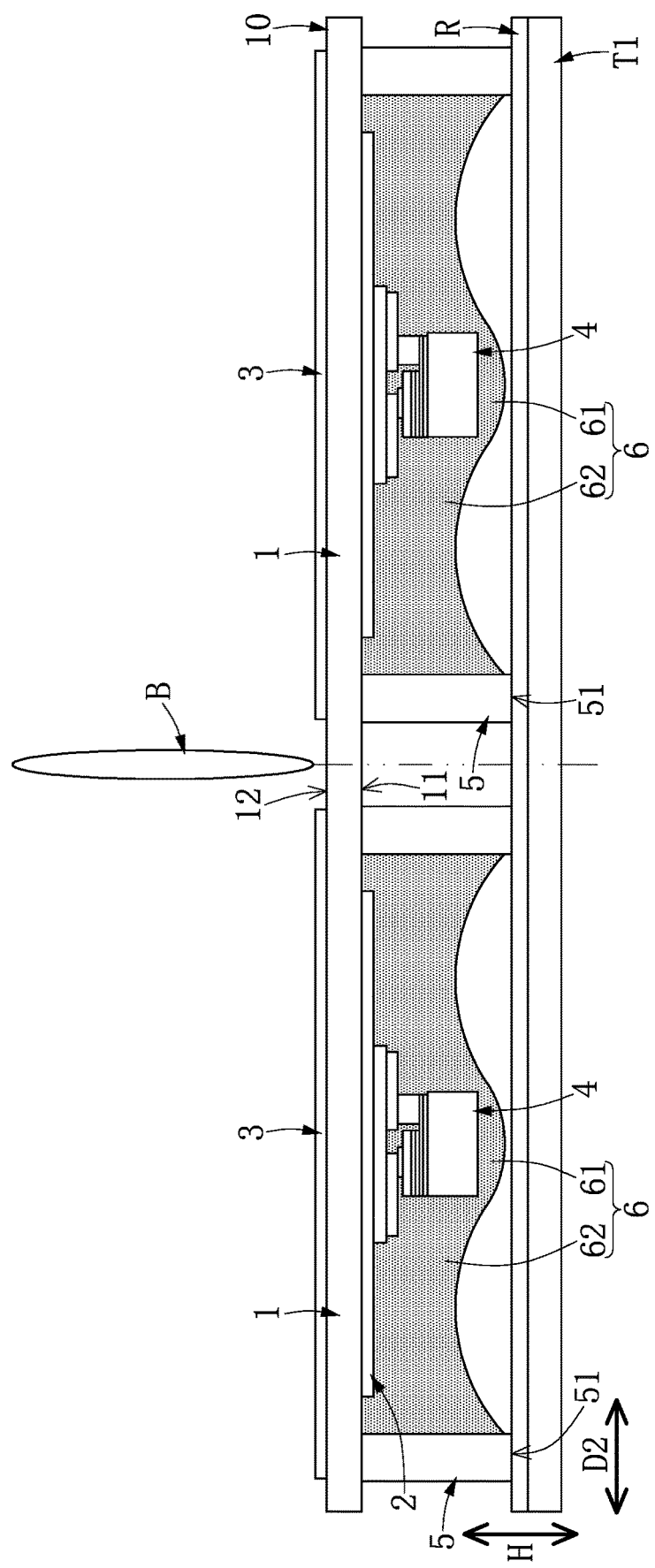
FIG. 6 is a schematic view showing steps S130 and S140 of the manufacturing method according to the first embodiment of the present disclosure.

As shown in FIGS. 5 and 6, the step S130 is carried out by attaching a top end 51 of each of the walls 5 onto a release film R that is adhered to a first tape T1. The release film R and the first tape T1 in the present embodiment can each be a pyrolysis film (or tape), a thermal-resistant film (or tape), or a UV film (or tape), but the present disclosure is not limited thereto.

Figure 7:
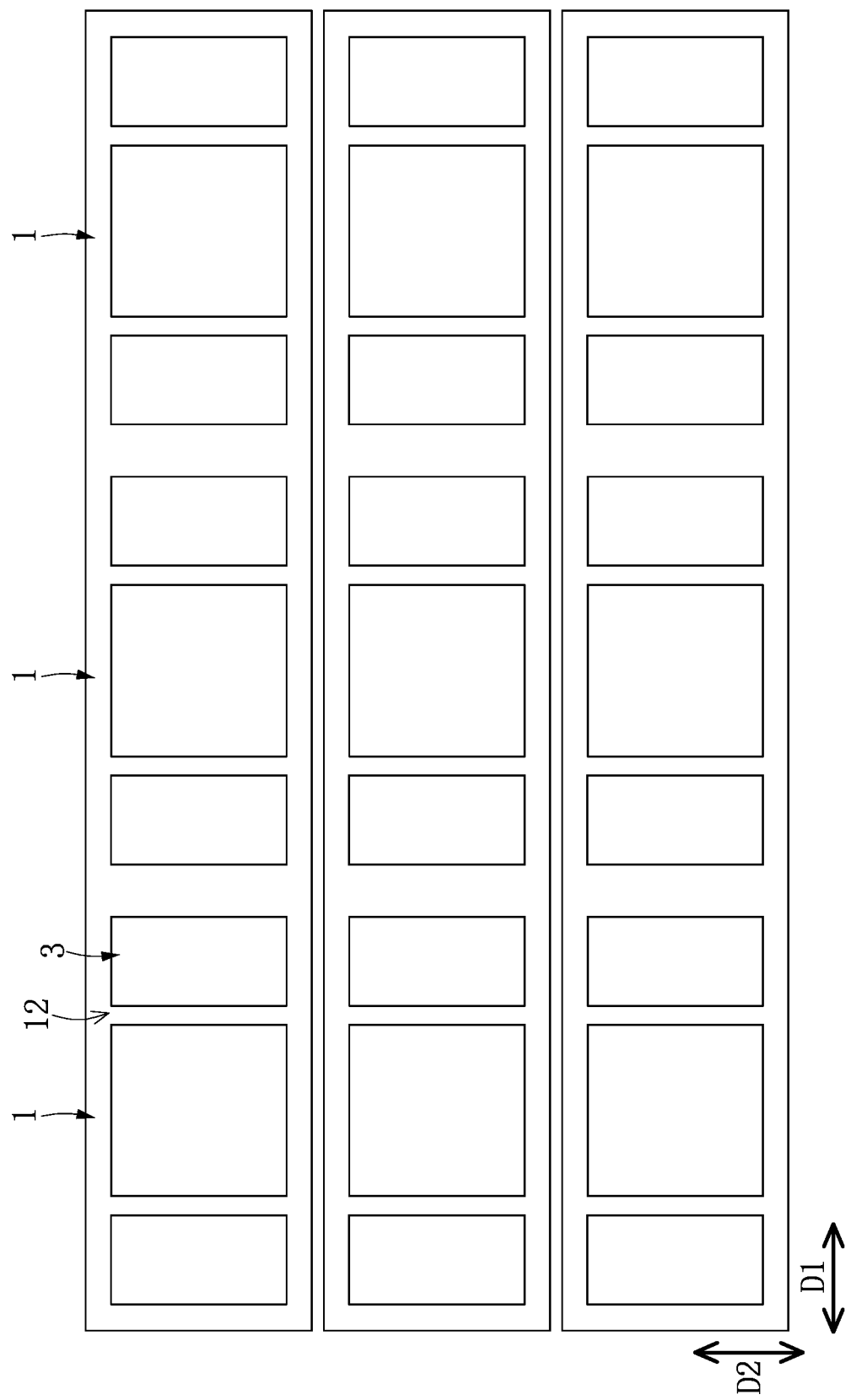
FIG. 7 is a schematic view showing step S140 of the manufacturing method according to the first embodiment of the present disclosure.

As shown in FIGS. 6 and 7, the step S140 is carried out by using a blade B to slice from the second surfaces 12 of the substrate assembly 10 along the first direction D1 (as shown in FIGS. 5 and 6) to form a plurality of rows of the substrates 1 that are separate from each other (as shown in FIG. 7). In other words, the substrates 1 of the substrate assembly 10 are respectively connected along the first direction D1 so as to form the rows of the substrates 1 as shown in FIG. 7, and the rows of the substrates 1 separate from each other along the second direction D2.

Figure 8:
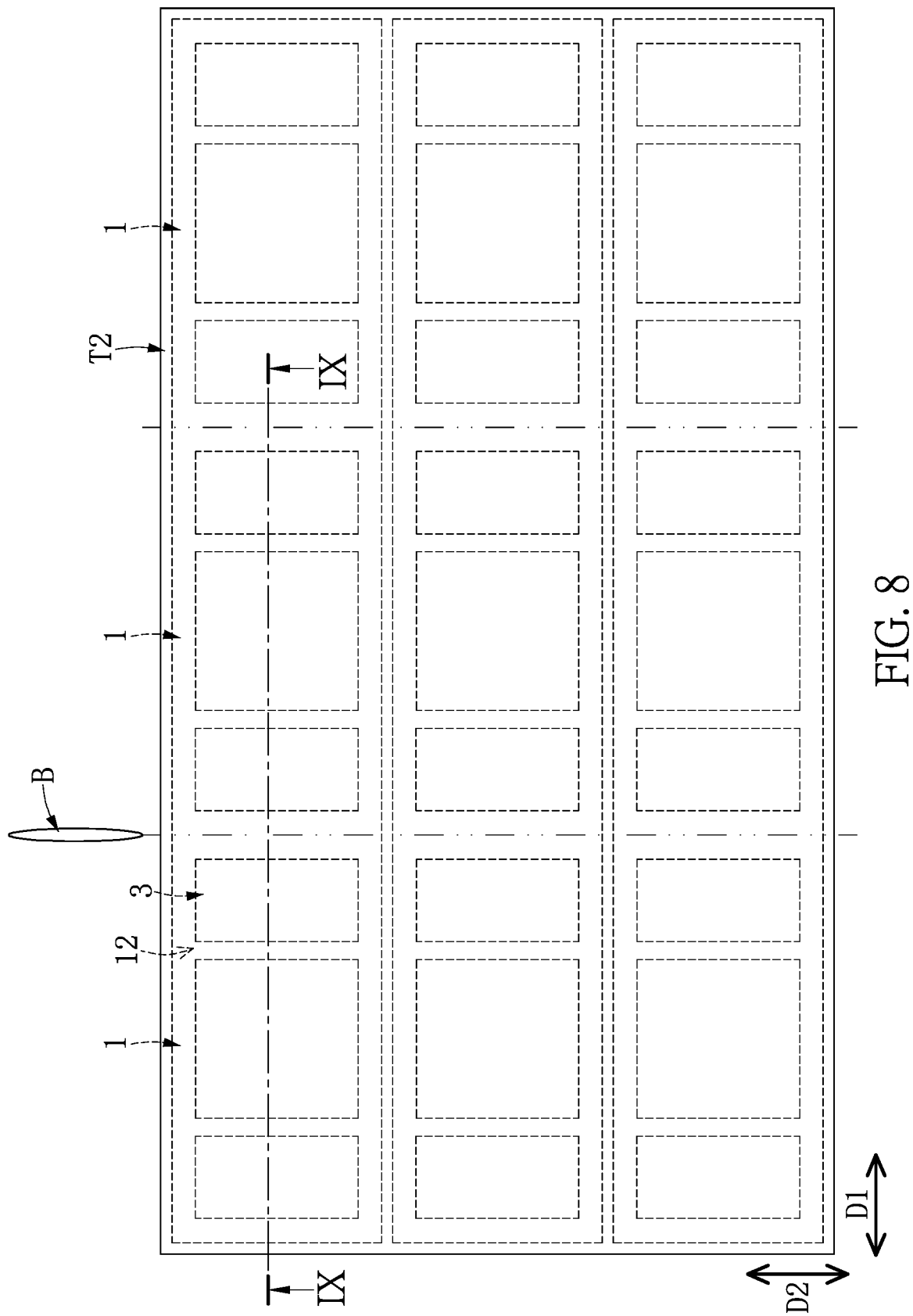
FIG. 8 is a schematic view showing step S150 of the manufacturing method according to the first embodiment of the present disclosure.
Figure 9:
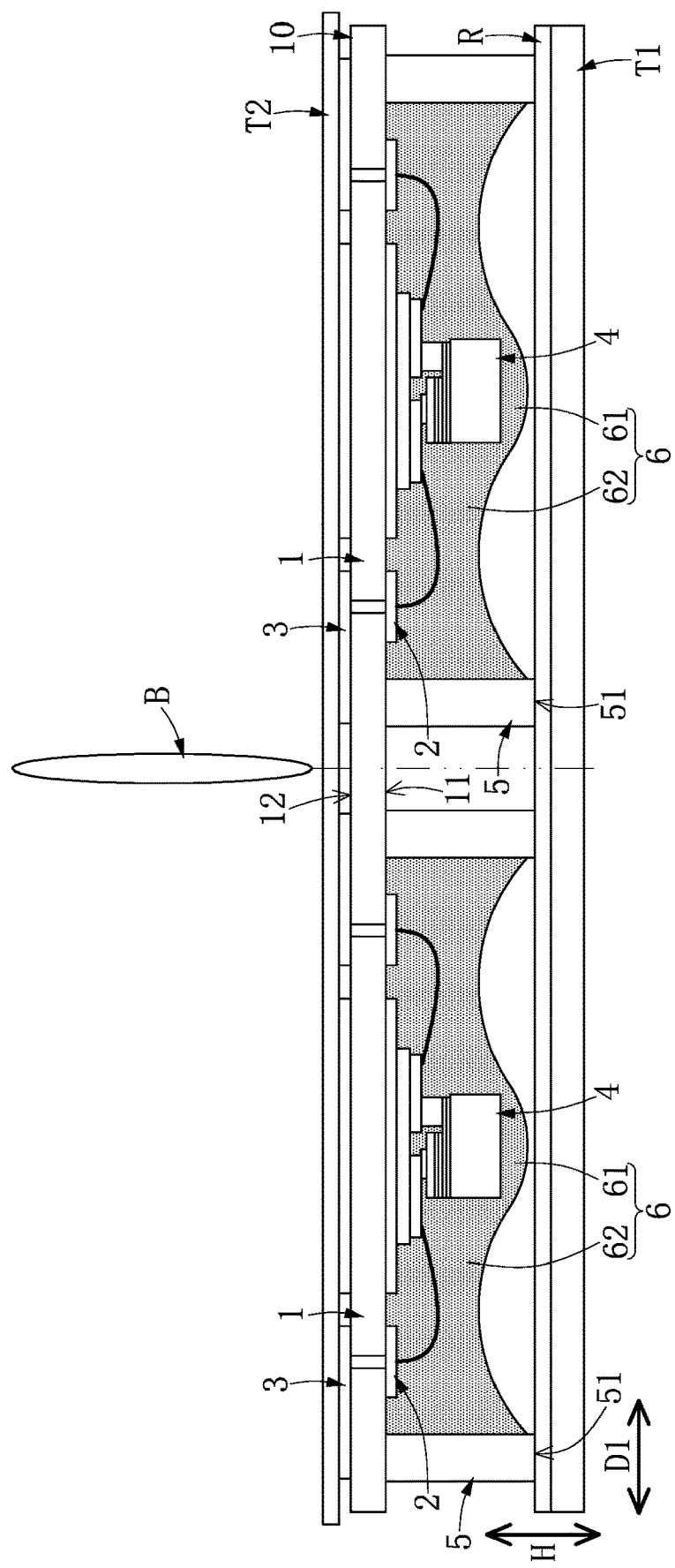
FIG. 9 is a schematic view showing steps S150 and S160 of the manufacturing method according to the first embodiment of the present disclosure.

As shown in FIGS. 8 and 9, the step S150 is carried out by attaching the second surfaces 12 of the rows of the substrates 1 onto a second tape T2 (e.g., adhering the second tape T2 to the solder pad layers 3). The second tape T2 in the present embodiment can be a pyrolysis tape, a thermal-resistant tape, or a UV tape, but the present disclosure is not limited thereto. In other words, the relative positions of the rows of the substrates 1 can be effectively maintained by attaching the rows of the substrates 1 onto the second tape T2.

Figure 10:
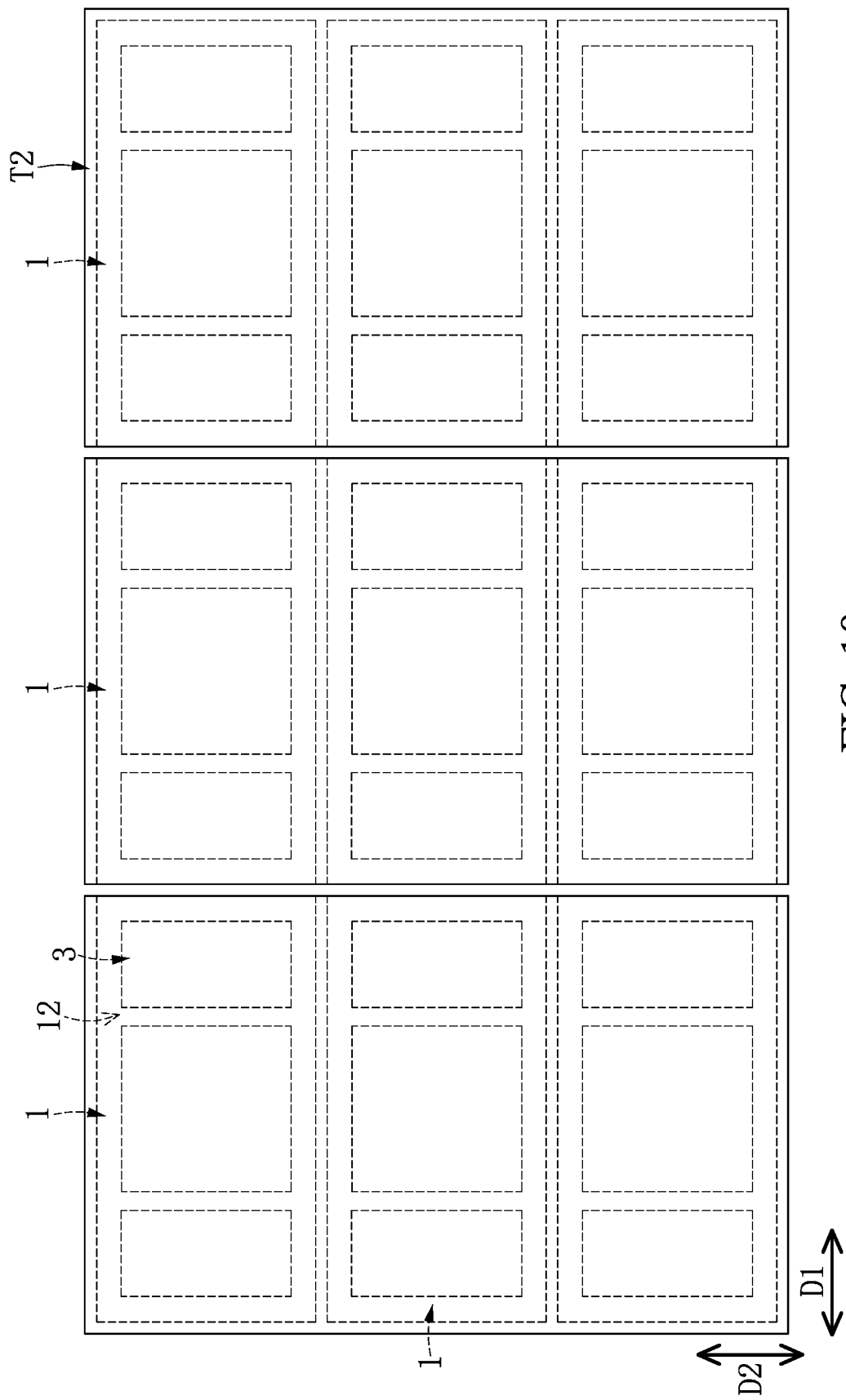
FIG. 10 is a schematic view showing step S160 of the manufacturing method according to the first embodiment of the present disclosure.

As shown in FIGS. 9 and 10, the step S160 is carried out by using the blade B to slice the rows of the substrates 1 from the second tape T2 along the second direction D2 so as to form the substrates 1 that are separate from each other and are in a matrix arrangement as shown in FIG. 10. Specifically, the substrates 1 can be rotated about 90 degrees in the steps S140 and S160, such that the slicing of the step S140 along the first direction D1 and the slicing of the step S160 along the second direction D2 can be easily implemented by the blade B, but the present disclosure is not limited thereto. For example, in other embodiments of the present disclosure, the blade B can be rotated about 90 degrees in the step S160 for easy slicing along the second direction D2.

Figure 11:
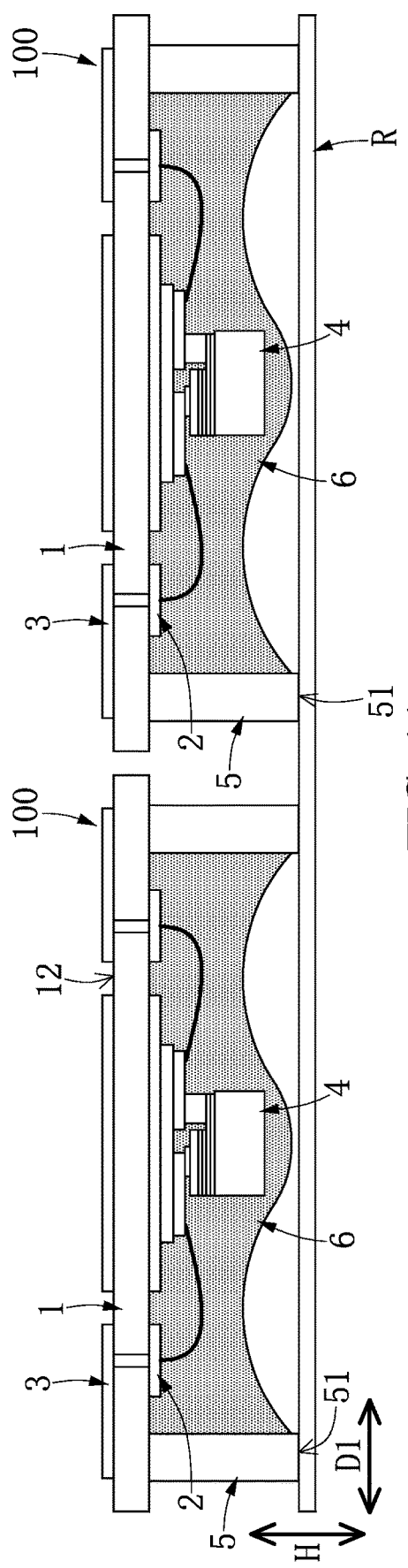
FIG. 11 is a first schematic view showing step S170 of the manufacturing method according to the first embodiment of the present disclosure.
Figure 12:
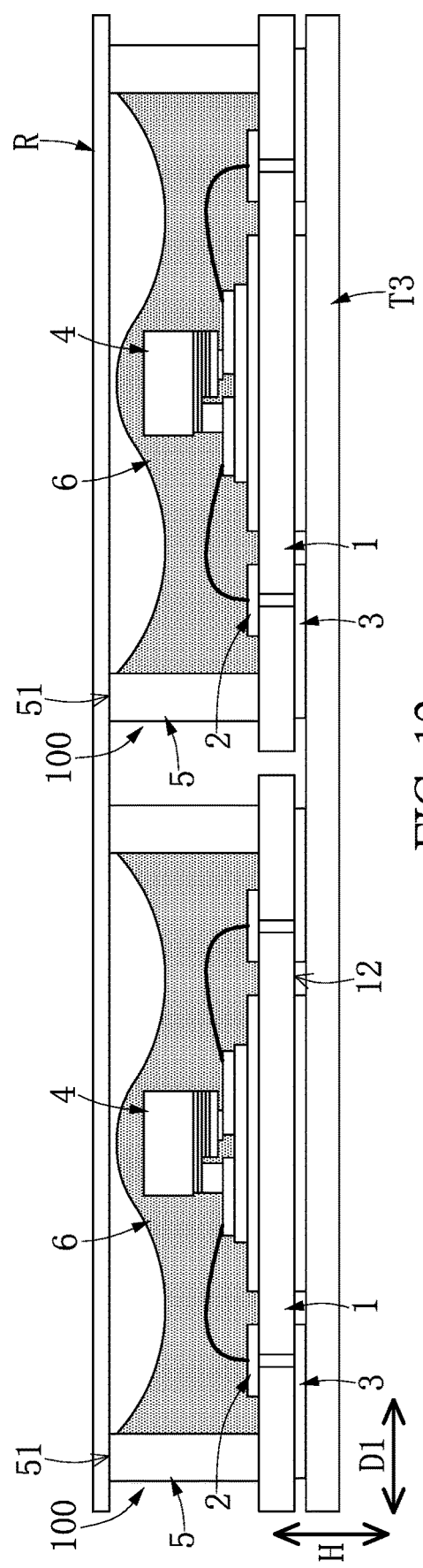
FIG. 12 is a second schematic view showing step S170 of the manufacturing method according to the first embodiment of the present disclosure.
Figure 13:
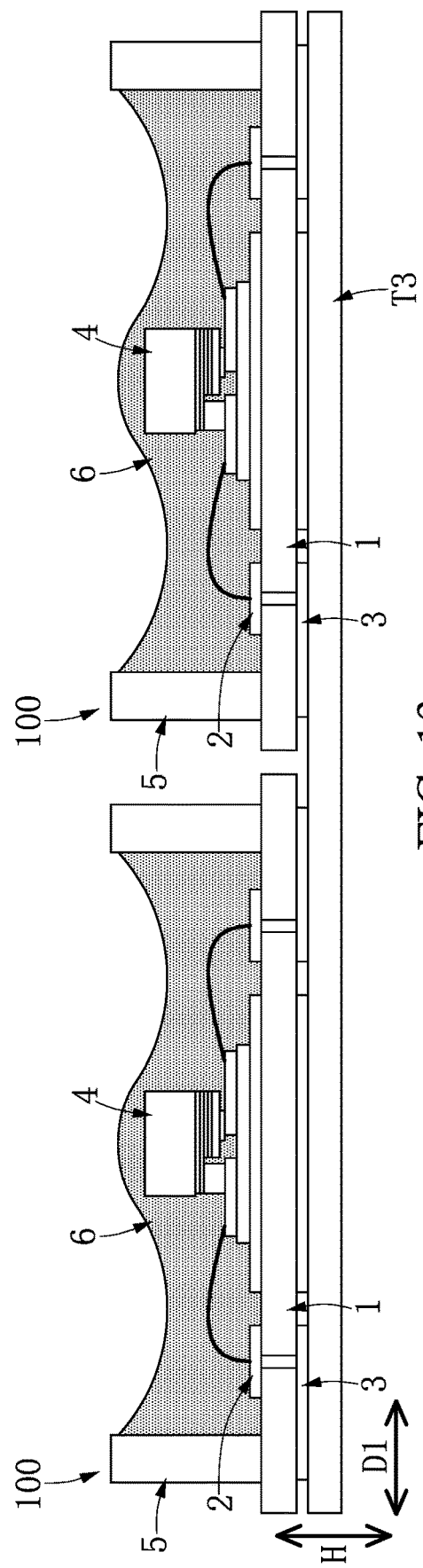
FIG. 13 is a third schematic view showing step S170 of the manufacturing method according to the first embodiment of the present disclosure.

As shown in FIGS. 11 to 13, the step S170 is carried out by removing the first tape T1, the second tape T2, and the release film R to obtain a plurality of LED package structures 100, such as a package structures. In the step S170, the release film R is preferably removed after removing the first tape T1 and the second tape T2. In the step S170, after the first tape T1 and the second tape T2 are removed as shown in FIG. 11, a third tape T3 can be attached onto the second surfaces 12 of the substrates 1 as shown in FIG. 12 (e.g., the third tape T3 is adhered to the solder pad layers 3), and then the release film R is removed to obtain the LED package structures 100 as shown in FIG. 13.

Moreover, a pre-process can be implemented on the first tape T1, the second tape T2, or the release film R for reducing the adhesion of the first tape T1, the second tape T2, or the release film R, such that the first tape T1, the second tape T2, and the release film R can be more easily removed. For example, the pre-process related to the release film R includes that the release film R can be heated, irradiated with a UV light, or contacted with an organic solution, thereby reducing the adhesion of the release film R with respect to each of the walls 5.

In addition, the step S110 can be replaced by step S110', and the step S110' is carried out by providing a carrier module M as shown in FIG. 1B. Specifically, a portion of the walls 5 arranged between any two adjacent lighting diodes 4 can be formed as one piece structure that is sliced in the steps S140, S160.

The manufacturing method of the present embodiment has been disclosed in the above description, and the following description discloses the package structure 100 prepared by using the manufacturing method of the present embodiment, but the present disclosure is not limited thereto. That is to say, the package structure 100 of the present embodiment can be prepared by using a method other than the manufacturing method of the present embodiment.

Figure 14A:
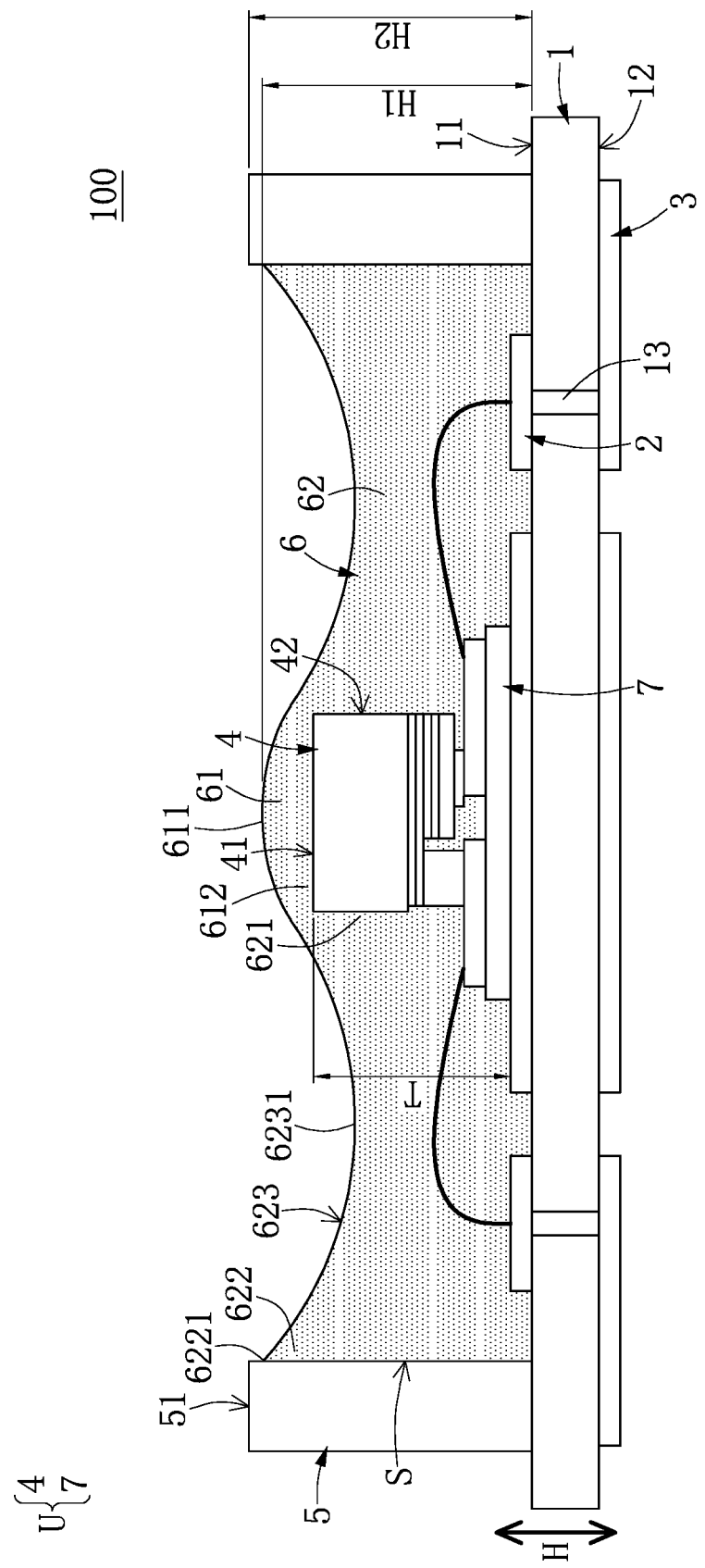
FIG. 14A is a schematic view showing the LED package structure according to the first embodiment of the present disclosure.

As shown in FIG. 14A, the package structure 100 includes a substrate 1, an electrode layer 2, a solder pad layer 3, a lighting unit U, an annular wall 5, and a package compound 6. In the present embodiment, the lighting unit U is an UV lighting unit for example, but the present disclosure is not limited thereto. In other embodiments of the present disclosure, the lighting unit U can be a laser lighting unit. The electrode layer 2 and the solder pad layer 3 are electrically connected to each other, and are disposed on two opposite surfaces of the substrate 1. The lighting unit U is disposed on the substrate 1 and is electrically connected to the electrode layer 2. The wall 5 is disposed on the substrate 1 and is arranged around the lighting unit U. The package compound 6 is disposed in the wall 5, and the lighting unit U is embedded in the package compound 6. The following description further discloses the structure and connection relationship of each component of the package structure 100.

The substrate 1 in the present embodiment is a ceramic substrate, but the present disclosure is not limited thereto. The substrate 1 has a first surface 11, and a second surface 12 opposite to the first surface 11. The substrate 1 defines a height direction H perpendicular to the first surface 11. The substrate 1 is provided with a plurality of conductive pillars 13 embedded therein. An end of each of the conductive pillars 13 is exposed from the first surface 11 of the substrate 1, and another end of each of the conductive pillars 13 is exposed from the second surface 12 of the substrate 1.

The electrode layer 2 is disposed on the first surface 11 of the substrate 1, and the solder pad layer 3 is disposed on the second surface 12 of the substrate 1. Two opposite ends of each of the conductive pillars 13, which are respectively exposed from the first surface 11 and the second surface 12 of the substrate 1, are respectively connected to the electrode layer 2 and the solder pad layer 3, such that the electrode layer 2 and the solder pad layer 3 are electrically connected to each other through the conductive pillars 13.

The lighting unit U in the present embodiment includes a lighting diode 4 4 and a submount 7. The lighting diode 4 is disposed on the submount 7, and is configured to emit a light having a wavelength within a range of 180 nm~410 nm (e.g., 260 nm~270 nm, 270 nm~290 nm, 305 nm~315 nm, or 320 nm~330 nm), but the present disclosure is not limited thereto. The lighting diode 4 has a top surface 41 and a surrounding lateral surface 42 connected to a peripheral edge of the top surface 41.

Moreover, the lighting diode 4 is disposed above the first surface 11 of the substrate 1, and is electrically connected to the electrode layer 2 and the solder pad layer 3. The electrical connection manner between the lighting diode 4 and the electrode layer 2 can be adjusted or changed according to design requirements. For example, as shown in FIG. 14A, the lighting diode 4 is connected to the submount 7 fixed on the electrode layer 2 in a flip-chip bonding manner, and the submount 7 is electrically connected to the electrode layer 2 in a wiring manner (e.g., a normal bonding or a reverse bonding) for establishing the electrical connection between the lighting diode 4 and the electrode layer 2.

The wall 5 in the present embodiment can be an aluminum wall or a polymer wall formed on the substrate 1, or the substrate 1 and the wall 5 can be integrally formed as a one-piece structure by a high temperature co-fired ceramic (HTCC) process or a low temperature co-fired ceramic (LTCC) process, but the present disclosure is not limited thereto.

The wall 5 is disposed on the first surface 11 of the substrate 1. The wall 5 and the first surface 11 of the substrate 1 jointly define an accommodating space S, and the lighting diode 4 is arranged in the accommodating space S. In other words, a top end of the wall 5 is higher than the top surface 41 of the lighting diode 4.

The material of the package compound 6 in the present embodiment includes a polydimethylsiloxane (PDMS) or a fluoropolymer, but the present disclosure is not limited thereto. The package compound 6 is arranged in the accommodating space S, and the electrode layer 2 and the lighting diode 4 are entirely (or at least partially) embedded in the package compound 6. Moreover, a top end of the package compound 6 has a cross section that is in a substantial W shape (as shown in FIG. 14A), but the package compound 6 of the present disclosure is not limited by the present embodiment.

Specifically, the package compound 6 includes an attaching portion 61 adhered to the top surface 41 of the lighting diode 4 and a surrounding portion 62 arranged around the attaching portion 61. The top surface 41 of the lighting diode 4 is entirely covered by the attaching portion 61. The attaching portion 61 is substantially in a cone shape and has a curved outer surface. A cross section of the attaching portion 61 perpendicular to the height direction H gradually becomes bigger in a direction from a top end 611 of the attaching portion 61 toward the top surface 41 of the lighting diode 4. A height H1 of the top end 611 of the attaching portion 61 with respect to the first surface 11 is lower than a height H2 of the top end 51 of the wall 5 with respect to the first surface 11. In addition, in other embodiments of the present disclosure, the height H1 of the top end 611 of the attaching portion 61 with respect to the first surface 11 can be higher than a height H2 of the top end 51 of the wall 5 with respect to the first surface 11.

Moreover, the surrounding portion 62 has an inner annular part 621, an outer annular part 622, and a top surface 623 connecting a top end of the inner annular part 621 and a top end of the outer annular part 622. The inner annular part 621 is connected to a peripheral edge of a bottom part 612 of the attaching portion 61 and the surrounding lateral surface 42 of the lighting diode 4. The outer annular part 622 is connected to an inner surface of the wall 5. The surrounding portion 62 has an annular slot formed on the top surface 623 thereof. That is to say, a height of the top surface 623 of the surrounding portion 62 with respect to the surface 11 of the substrate 1 gradually decreases in a direction from the inner annular part 621 and the outer annular part 622 toward a substantial center therebetween. In addition, the top end 611 of the attaching portion 61 is lower than the top end 51 of the wall 5, thereby preventing the light-permeable cover 8 from pressuring the attaching portion 61.

Specifically, a bottom end 6231 of the annular slot is located at a position aligning with 25%~90% of the thickness T of the lighting diode 4 and the submount 7 along the height direction H. In other words, in a cross section of the package compound 6 parallel to the height direction H and passing through the lighting diode 4, a top end of the cross section of the package compound 6 is in a substantial W shape that is formed by the outer surface of the attaching portion 61 and the top surface 623 of the surrounding portion 62.

In addition, since the surrounding portion 62 is connected to the peripheral edge of the bottom part 612 of the attaching portion 61, the curvature of the curved top surface 623 of the surrounding portion 62 can be adjusted according to design requirements. In the present embodiment, the top end 611 of the attaching portion 61 and a top end 6221 of the outer annular part 622 of the surrounding portion 62 are substantially arranged at the same height with respect to the substrate 1, such that the top surface 623 of the surrounding portion 62 can be formed with a larger radius of curvature, but the present disclosure is not limited thereto. Specifically, a center of curvature of the top surface 623 is located outside of the accommodating space S. Therefore, light emitted from the top surface 623 of the surrounding portion 62 can be gathered outside of the wall 5, thereby preventing light spots from being formed inside of the wall 5.

Moreover, since the surrounding portion 62 is connected to the peripheral edge of the bottom part 612 of the attaching portion 61, the surrounding lateral surface 42 of the lighting diode 4 can be entirely covered by the surrounding portion 62, thereby preventing light leakage from the package structure 100. In summary, the package compound 6 in the present embodiment excludes a configuration where an attaching portion 61 and a surrounding portion 62 are separate from each other. A lighting efficiency of the package structure 100 of the present embodiment is more than that of another package structure, being without a W-shaped cross section and having a light-permeable cover 8 covering the lighting unit U, by 26%. Moreover, the light-permeable cover 8 can be prevented from exploding due to an internal air pressure when the package structure 100 is heated, so that the reliability of the package structure 100 is not affected.

Figure 14B:
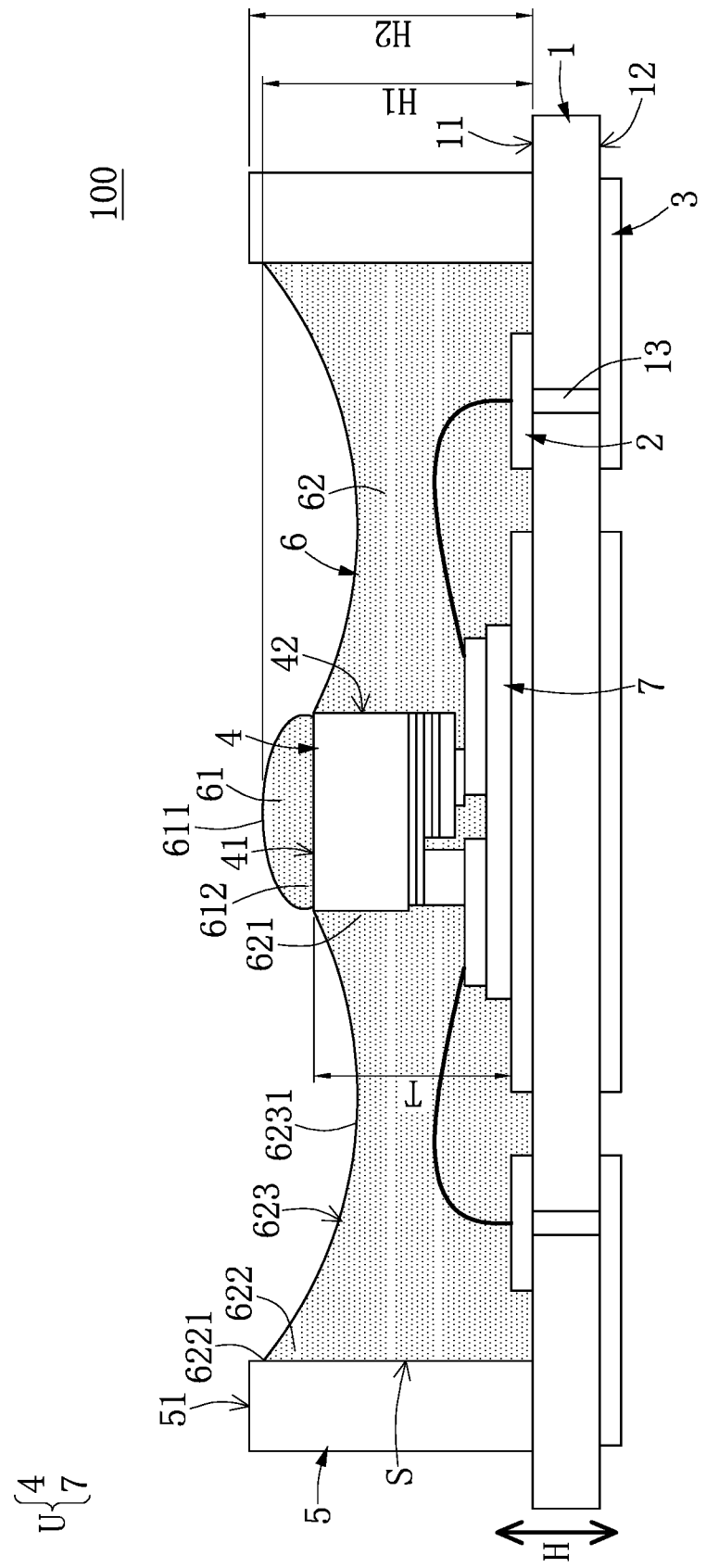
FIG. 14B is a schematic view showing the LED package structure in another configuration according to the first embodiment of the present disclosure.

In addition, the inner annular part 621 of the surrounding portion 62 in the present embodiment is arranged adjacent to and connected to the attaching portion 61, but the present disclosure is not limited thereto. For example, as shown in FIG. 14B, the inner annular part 621 of the surrounding portion 62 can be arranged adjacent to and spaced apart from the attaching portion 61.

Second Embodiment

Figure 15A:
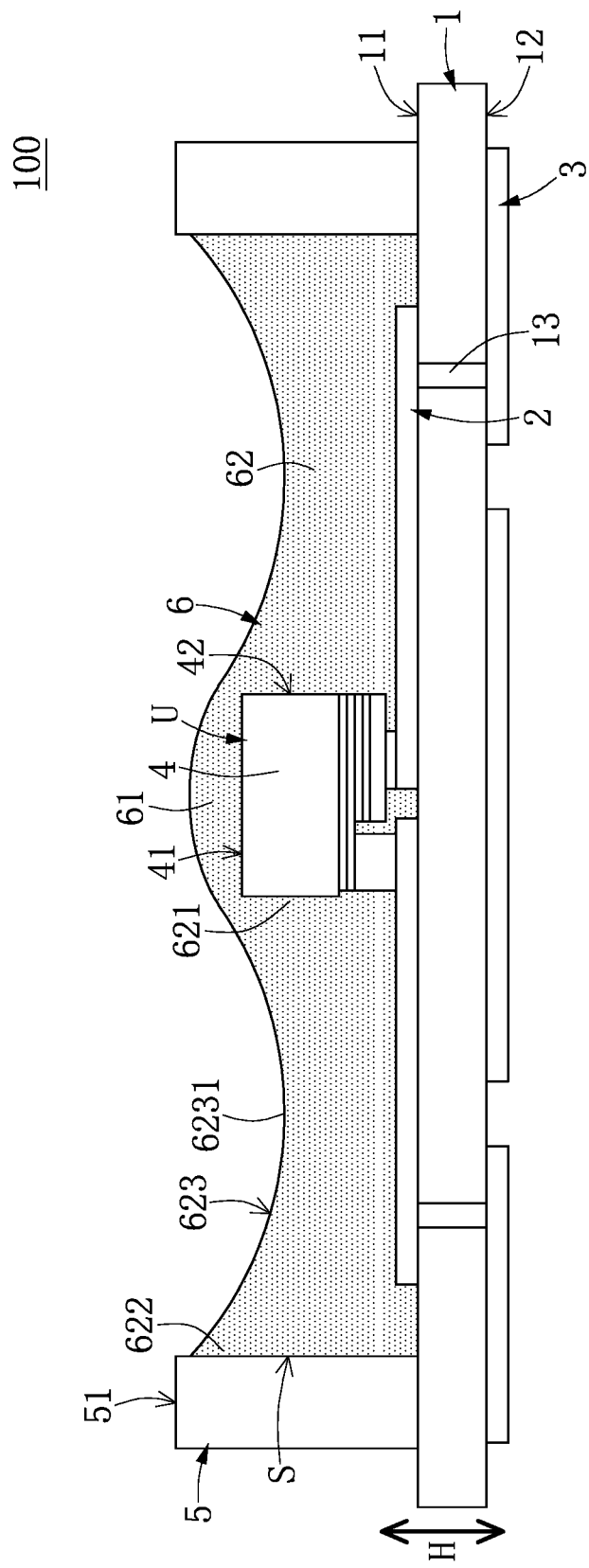
FIG. 15A is a schematic view showing an LED package structure according to a second embodiment of the present disclosure.
Figure 15B:
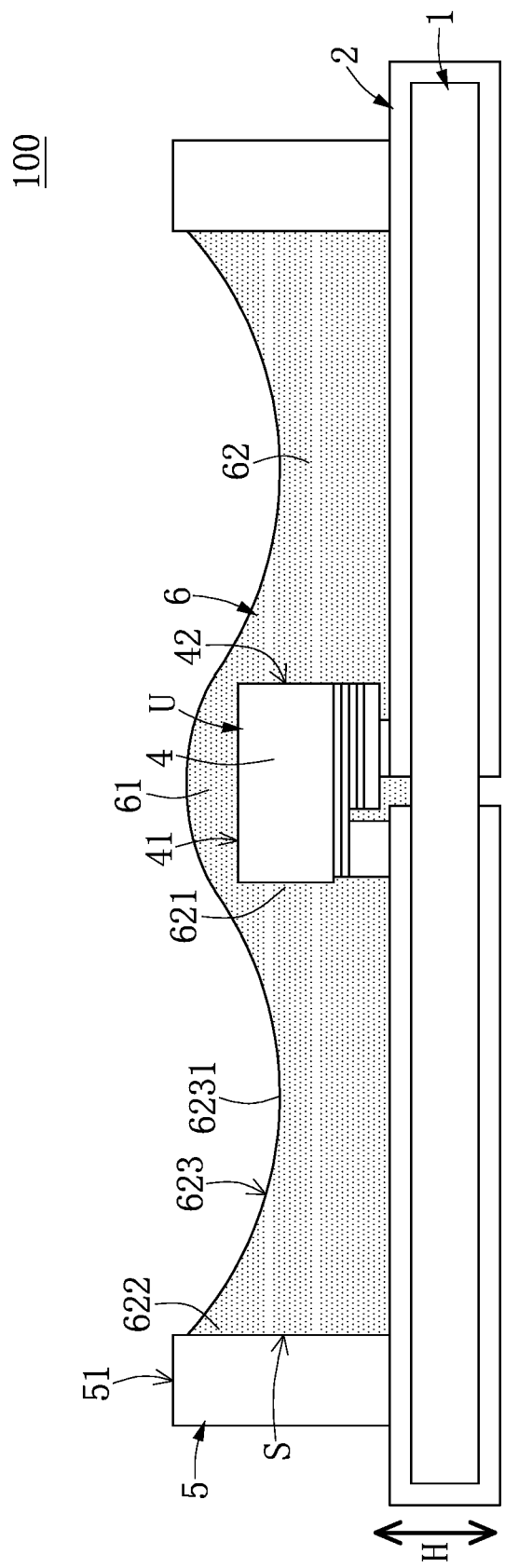
FIG. 15B is a schematic view showing the LED package structure in another configuration according to the second embodiment of the present disclosure.

Reference is made to FIG. 15A and FIG. 15B, which illustrates a second embodiment of the present disclosure. The second embodiment is similar to the first embodiment, so that the identical features are not disclosed in the following description. The difference between the second embodiment and the first embodiment resides in the lighting unit U. Specifically, as shown in FIG. 15A, the lighting unit U of the present embodiment includes only the lighting diode 4, which is directly mounted on the electrode layer 2.

Moreover, as shown in FIG. 15B, the electrode layer 2 (i.e., the pair of electrodes 2) can be formed as a leadframe configuration.

Third Embodiment

Figure 16:
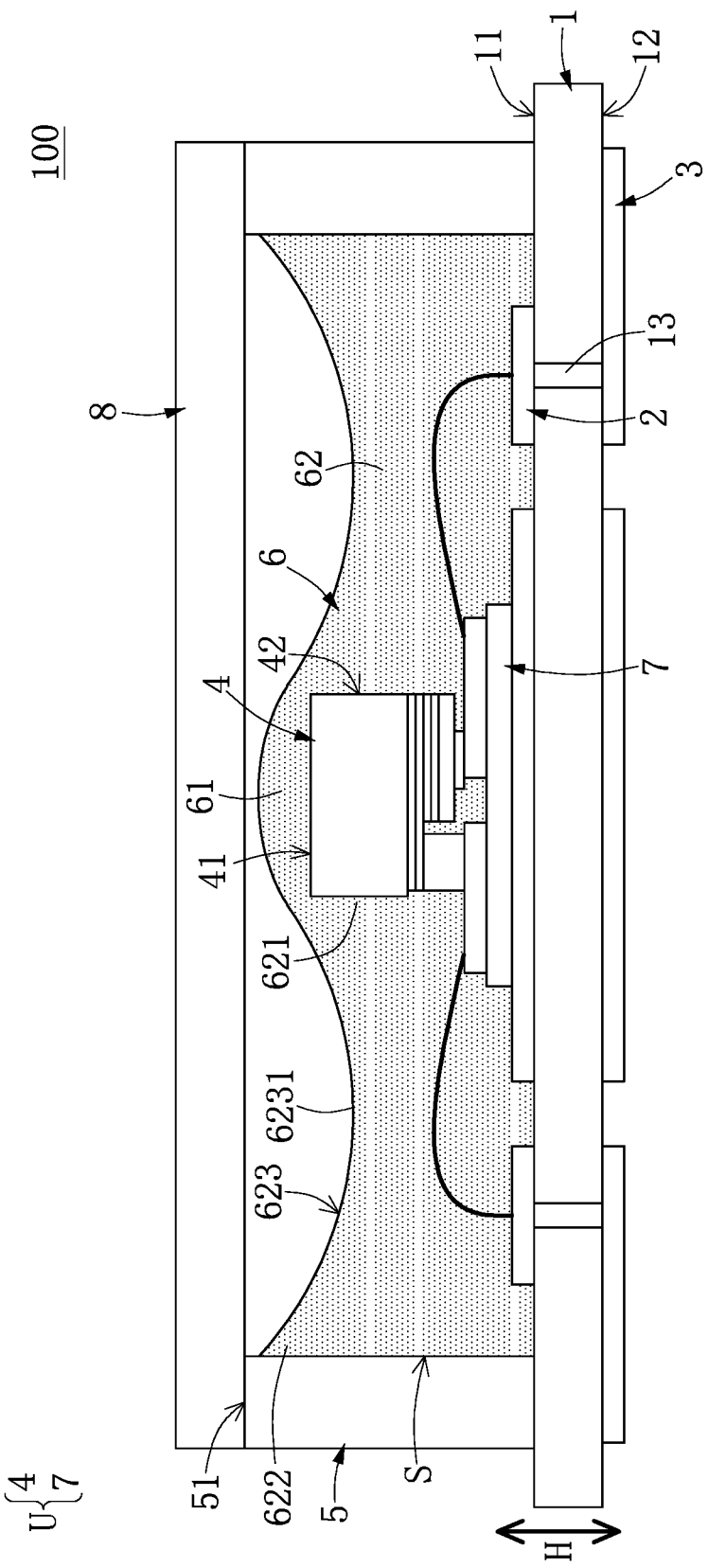
FIG. 16 is a schematic view showing an LED package structure according to a third embodiment of the present disclosure.

Reference is made to FIG. 16, which illustrates a third embodiment of the present disclosure. The third embodiment is similar to the first and second embodiments, so that the identical features are not disclosed in the following description. The difference between the third embodiment and the first and second embodiments is disclosed as follows. The package structure 100 of the present embodiment further includes a light-permeable cover 8 (e.g., a transparent plate). The light-permeable cover 8 is disposed on the top end 51 of the wall 5 so as to enclose the accommodating space S. That is to say, the light-permeable cover 8 is arranged above the lighting unit U. The lighting unit U can only include a lighting diode 4, or the lighting unit U can include a lighting diode 4 and a submount 7. Accordingly, the lighting efficiency of the package structure 100 of the present embodiment is more than that of another package structure mentioned in the first embodiment by 13%. Moreover, since the package structure 100 of the present embodiment is provided with the package compound 6 having a W-shaped cross section, an external air in the package structure 100 can be reduced. Accordingly, the light-permeable cover 8 can be prevented from exploding due to an internal air pressure when the package structure 100 is heated, so that the reliability of the package structure 100 is not affected.

In addition, the light-permeable cover 8 in the present embodiment is a flat plate, but the present disclosure is not limited thereto. For example, in other embodiments of the present disclosure, the light-permeable cover 8 can be a dome lens.

Technical Effects of the Present Embodiments

In summary, the package structure and the manufacturing method thereof provided by the present embodiment can increase the performance of the package structure (e.g., a lighting efficiency) through the configuration of the package compound. Moreover, the manufacturing method of the present embodiment can be carried out to effectively prevent spattering during a slicing process of the substrate assembly.

The descriptions illustrated supra set forth simply the exemplary embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A package structure, comprising:
   a substrate and a pair of electrodes disposed on the substrate, wherein the substrate has a first surface and a second surface opposite to the first surface, and the substrate defines a height direction perpendicular to the first surface;
   a lighting unit including an lighting diode, wherein the lighting diode has a top surface and a surrounding lateral surface connected to a peripheral edge of the top surface, and the lighting unit is disposed on the first surface of the substrate and is electrically connected to the pair of electrodes;

a wall disposed on the first surface of the substrate, wherein the wall and the first surface jointly define an accommodating space, and the lighting diode is arranged in the accommodating space; and a package compound arranged in the accommodating space, wherein the electrodes and the lighting diode are at least partially embedded in the package compound, and the package compound includes:

an attaching portion adhering to a top surface of the lighting diode, wherein a height of a top end of the attaching portion with respect to the first surface is less than a height of the wall with respect to the first surface; and a surrounding portion that is arranged around a surrounding lateral surface of the lighting unit and integrally extends from the attaching portion so that light emitted from the surrounding lateral surface is directly guided upward through the surrounding portion, and wherein the surrounding portion has an inner annular part and an outer annular part, wherein the inner annular part is arranged adjacent to the attaching portion, the surrounding portion is connected to an inner surface of the wall, the surrounding portion has an annular slot formed on a top surface thereof, and a bottom end of the annular slot is located at a position aligning with 25~90% of a thickness of the lighting unit along the height direction, wherein the attaching portion and the surrounding portion allow light generated by the lighting unit to pass there-through, and the surrounding portion contacts the surrounding lateral surface of the lighting unit, wherein the top surface of the surrounding portion is in a curved shape, and a center of a curvature of the top surface of the surrounding portion is arranged outside of the accommodating space, wherein a height of a top end of the outer annular part of the surrounding portion is higher than a height of the top surface of the lighting diode, and wherein the lighting unit is arranged at a center of the package compound and the surrounding portion is formed symmetrically about the attaching portion.

2. The package structure as claimed in claim 1, wherein the lighting diode is configured to emit a light having a wavelength within a range of 180 nm~410 nm.

3. The package structure as claimed in claim 1, wherein the lighting unit includes a submount, the lighting diode is electrically connected to two electrodes of the submount, and an electrical connection between the lighting diode and the pair of electrodes is established by wiring the two electrodes of the submount to the pair of electrodes.

4. The package structure as claimed in claim 1, wherein the material of the package compound includes a polydimethylsiloxane (PDMS) or a fluoropolymer.

5. The package structure as claimed in claim 1, wherein a top end of the package compound has a cross section that is in a substantial W shape.

6. The package structure as claimed in claim 1, further comprising a light-permeable cover disposed on a top end of the wall so as to enclose the accommodating space.

7. The package structure as claimed in claim 1, wherein the substrate is a ceramic substrate, the wall is an aluminum wall or a polymer wall formed on the substrate.

8. The package structure as claimed in claim 1, wherein the substrate and the wall are integrally formed as a one-piece structure by a high temperature co-fired ceramic (HTCC) process or a low temperature co-fired ceramic (LTCC) process.

9. The package structure as claimed in claim 1, wherein the pair of electrodes is formed as a leadframe configuration.

10. A manufacturing method for a package structure, comprising:

providing a carrier module that includes:
a substrate assembly including a plurality of substrates connected to each other, wherein each of the substrates has a first surface and a second surface opposite to the first surface;
a plurality of pairs of electrodes respectively disposed on the first surfaces of the substrates;
a plurality of walls respectively disposed on the first surfaces of the substrates; and respectively disposing a plurality of lighting diodes in the walls corresponding in position to the first surfaces of the substrates, wherein each of the lighting diodes is electrically connected to the corresponding pair of electrodes; and implementing a dispensing process on an inner side of each of the walls by using a dispenser, wherein in each of the dispensing processes, the dispenser outputs a package compound to form an attaching portion arranged on a top surface of the lighting diode and to form a surrounding portion toward the wall and the substrate so as to embed the pair of electrodes and the lighting diode, wherein the surrounding portion is arranged around and contacts a surrounding lateral surface of a lighting unit and integrally extends from the attaching portion so that light emitted from the surrounding lateral surface is directly guided upward through the surrounding portion, wherein the surrounding portion has an annular slot formed on a top surface thereof, and a bottom end of the annular slot is located at a position aligning with 25%~90% of a thickness of the lighting diode along a height direction perpendicular to the first surface, wherein the attaching portion and the surrounding portion allow light generated by the lighting unit to pass there-through, wherein the wall and the first surface jointly define an accommodating space, wherein the top surface of the surrounding portion is in a curved shape, and a center of a curvature of the top surface of the surrounding portion is arranged outside of the accommodating space, wherein a height of a top end of the surrounding portion is higher than a height of the top surface of the lighting diode, and wherein the lighting unit is arranged at a center of the package compound and the surrounding portion is formed symmetrically about the attaching portion.

11. The manufacturing method as claimed in claim 10, wherein each of the lighting diodes is selected for emitting a light having a wavelength within a range of 180 nm~410 nm.

12. The manufacturing method as claimed in claim 10, wherein after the inner side of each of the walls is formed with the corresponding package compound, the manufacturing method further comprises:

attaching a top end of each of the walls onto a release film that is adhered to a first tape;

slicing from the second surfaces of the substrate assembly along a first direction to form a plurality of rows of the substrates that are separate from each other;

attaching the second surfaces of the rows of the substrates onto a second tape;

slicing the rows of the substrates from the second tape along a second direction perpendicular to the first direction so as to form the substrates that are separate from each other and are in a matrix arrangement; and removing the first tape, the second tape, and the release film to obtain a plurality of package structures.

13. The manufacturing method as claimed in claim 12, wherein the release film is removed after removing the first tape and the second tape.

14. The manufacturing method as claimed in claim 13, wherein before the release film is removed, the release film is heated, irradiated with a UV light, or contacted with an organic solution for reducing an adhesion of the release film with respect to each of the walls.

15. The manufacturing method as claimed in claim 13, wherein after the first tape and the second tape are removed, a third tape is attached onto the second surfaces of the substrates, and then the release film is removed.

16. The manufacturing method as claimed in claim 10, wherein in each of the dispensing processes, the dispenser starts to output the package compound at a first position that is about 0.2 mm above the top surface of the lighting diode, and then the dispenser gradually moves in a direction away from the top surface until reaching a second position that is about 0.5 mm above the top surface of the lighting diode.

17. The manufacturing method as claimed in claim 10, wherein the carrier module includes a plurality of submounts respectively disposed on the first surfaces of the substrates and each having two electrodes electrically connected to the corresponding lighting diode, and the two electrodes of each of the submounts are electrically connected to the corresponding pair of electrodes in a wiring manner.

18. The manufacturing method as claimed in claim 11, further comprising: respectively disposing a plurality of light-permeable covers onto the top ends of the walls to enclose the accommodating space surroundingly defined by each of the walls and the corresponding substrate.

19. The manufacturing method as claimed in claim 10, wherein in each of the dispensing processes, the dispenser outputs the package compound toward the top surface of the lighting diode so as to form the attaching portion, and then the package compound further flows from a periphery of the attaching portion toward the wall and the substrate so as to form the surrounding portion.

* * * * *

(12) INTER PARTES REVIEW CERTIFICATE (3246th)
United States Patent
Cheng et al.

(10) Number: US 10,916,685 K1
(45) Certificate Issued: Sep. 27, 2023

(54) PACKAGE STRUCTURE AND MANUFACTURING METHOD THEREOF

(71) Applicants: Wei-Te Cheng; Kuo-Ming Chiu; Meng-Sung Chou; Kai-Chieh Liang

(72) Inventors: Wei-Te Cheng; Kuo-Ming Chiu; Meng-Sung Chou; Kai-Chieh Liang

(73) Assignees: LITE-ON OPTO TECHNOLOGY (CHANGZHOU) CO., LTD.; LITE-ON TECHNOLOGY CORPORATION

Trial Number:

IPR2022-00395 filed Jan. 3, 2022

Inter Partes Review Certificate for:

Patent No.: 10,916,685
Issued: Feb. 9, 2021
Appl. No.: 16/009,005
Filed: Jun. 14, 2018

The results of IPR2022-00395 are reflected in this inter partes review certificate under 35 U.S.C. 318(b).

INTER PARTES REVIEW CERTIFICATE
U.S. Patent 10,916,685 K1
Trial No. IPR2022-00395
Certificate Issued Sep. 27, 2023

AS A RESULT OF THE INTER PARTES REVIEW PROCEEDING, IT HAS BEEN DETERMINED THAT:

Claim 3 is found patentable.

Claims 1, 2 and 5 are cancelled.

1. (substitute for claim 20) *A package structure, comprising:*
*a substrate and a pair of electrodes disposed on the substrate,*
*wherein the substrate has a first surface and a second surface opposite to the first surface, and the substrate defines a height direction perpendicular to the first surface;*
*a lighting unit including an lighting diode, wherein the lighting diode has a top surface and a surrounding lateral surface connected to a peripheral edge of the top surface, and the lighting unit is disposed on the first surface of the substrate and is electrically connected to the pair of electrodes;*
*a wall disposed on the first surface of the substrate, wherein the wall and the first surface jointly define an accommodating space, and the lighting diode is arranged in the accommodating space; and*
*a package compound arranged in the accommodating space and that partially fills the accommodating space, wherein the electrodes and the lighting diode are at least partially embedded in the package compound, and the package compound includes:*
*an attaching portion adhering to a top surface of the lighting diode, wherein a height of a top end of the attaching portion with respect to the first surface is less than a height of the wall with respect to the first surface; and*
*a surrounding portion that is arranged around a surrounding lateral surface of the lighting unit and integrally extends from the attaching portion so that light emitted from the surrounding lateral surface is directly guided upward through the surrounding portion, and*
*wherein the surrounding portion has an inner annular part and an outer annular part, wherein the inner annular part is arranged adjacent to the attaching portion, the surrounding portion is connected to an inner surface of the wall,*
*the surrounding portion has an annular slot formed on a top surface thereof, and a bottom end of the annular slot is located at a position aligning with 25~90% of a thickness of the lighting unit along the height direction,*
*wherein the attaching portion and the surrounding portion allow light generated by the lighting unit to pass there-through, and*
*the surrounding portion contacts the surrounding lateral surface of the lighting unit,*
*wherein the top surface of the surrounding portion is in a curved shape and a center of a curvature of the top surface of the surrounding portion is arranged outside of the accommodating space, and wherein the top surface provides an interface to the air above the package compound,*
*wherein a height of a top end of the outer annular part of the surrounding portion is higher than a height of the top surface of the lighting diode, and*
*wherein the lighting unit is arranged at a center of the package compound and the surrounding portion is formed symmetrically about the attaching portion.*

2. (substitute for claim 21) *The package structure as claimed in claim* 20, *wherein the lighting diode is configured to emit a light having a wavelength within a range of 180nm-410nm, and wherein a top end of the attaching portion and a top end of the outer annular part of the surrounding portion are substantially arranged at a same height with respect to the substrate.*

5. (substitute for claim 22) *The package structure as claimed in claim* 20, *wherein a top end of the package compound has a cross section that is in a substantial W shape, and wherein only a single layer of package compound forms the attaching portion 61 and the surrounding portion 62.*

* * * * *